US009478889B2

(12) United States Patent
Oshida

(10) Patent No.: US 9,478,889 B2
(45) Date of Patent: Oct. 25, 2016

(54) ELECTRICAL CONNECTOR AND ELECTRICAL CONNECTOR ASSEMBLED COMPONENT

(71) Applicant: Hirose Electric Co., Ltd., Tokyo (JP)

(72) Inventor: Tadashi Oshida, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 191 days.

(21) Appl. No.: 14/287,116

(22) Filed: May 26, 2014

(65) Prior Publication Data

US 2014/0357131 A1 Dec. 4, 2014

(30) Foreign Application Priority Data

May 29, 2013 (JP) ................................ 2013-112683

(51) Int. Cl.

| | |
|---|---|
| ***H01R 12/00*** | (2006.01) |
| ***H05K 1/00*** | (2006.01) |
| ***H01R 13/42*** | (2006.01) |
| ***H01R 12/71*** | (2011.01) |
| ***H01R 12/91*** | (2011.01) |
| ***H01R 13/506*** | (2006.01) |
| ***H01R 13/6585*** | (2011.01) |
| *H01R 12/70* | (2011.01) |
| *H01R 12/73* | (2011.01) |

(52) U.S. Cl.

CPC ............ *H01R 13/42* (2013.01); *H01R 12/712* (2013.01); *H01R 12/91* (2013.01); *H01R 13/506* (2013.01); *H01R 13/6585* (2013.01); *H01R 12/7082* (2013.01); *H01R 12/73* (2013.01)

(58) Field of Classification Search

CPC ... H01R 9/096; H01R 9/2491; H01R 12/716
USPC ............................................ 439/626, 74, 65
See application file for complete search history.

(56) References Cited

U.S. PATENT DOCUMENTS

| | | | | | |
|---|---|---|---|---|---|
| 6,695,622 | B2 * | 2/2004 | Korsunsky | H01R 31/06 | 439/631 |
| 6,918,774 | B2 * | 7/2005 | Wu | H01R 31/06 | 439/607.05 |
| 7,104,808 | B2 * | 9/2006 | Korsunsky | H01R 9/096 | 439/607.05 |
| 7,425,137 | B1 * | 9/2008 | Sipe | H01R 13/514 | 439/65 |
| 7,445,467 | B1 * | 11/2008 | Matsuo | H01R 13/514 | 439/637 |
| 7,520,756 | B2 * | 4/2009 | Nagata | H01R 13/41 | 439/74 |

(Continued)

FOREIGN PATENT DOCUMENTS

| | | | |
|---|---|---|---|
| CN | 102544794 | A | 7/2012 |
| JP | 04-051782 | A | 2/1992 |
| JP | 2001-143786 | A | 5/2001 |
| JP | 2004-348969 | A | 12/2004 |
| JP | 2012-089498 | A | 5/2012 |

*Primary Examiner* — Hae Moon Hyeon

(74) *Attorney, Agent, or Firm* — Kubotera & Associates, LLC

(57) ABSTRACT

An electrical connector is to be connected to a first mating connector and a second mating connector. The electrical connector includes a plurality of terminals; and a housing for holing the terminals in a terminal arrangement direction. The housing includes an upper housing and a lower housing attached to the upper housing. The upper housing includes a plurality of upper grooves for holding the terminals. Each of the upper grooves has an upper narrow width portion having a width smaller than other part of the upper groove. The lower housing includes a plurality of lower grooves for holing the terminal. Each of the lower grooves has a lower narrow width portion having a width smaller than other part of the lower groove.

6 Claims, 12 Drawing Sheets

(56) References Cited

U.S. PATENT DOCUMENTS 8,105,114 B2 * 1/2012 Kagotani ............... H01R 23/72 439/639
8,177,587 B2 * 5/2012 Takagi ................. H01R 13/113 439/249
8,360,789 B2 1/2013 Yin et al.
8,425,236 B2 * 4/2013 Cipolla ................ H01R 12/716 439/59
8,721,350 B2 * 5/2014 Liu ........................ H01R 12/73 439/65

* cited by examiner

ELECTRICAL CONNECTOR AND ELECTRICAL CONNECTOR ASSEMBLED COMPONENT

BACKGROUND OF THE INVENTION AND RELATED ART STATEMENT

The present invention relates to an electrical connector, and an electrical connector assembled component that includes the electrical connector and a mating connector thereof. More specifically, the present invention relates to an electrical connector having a terminal configured so that a contact portion of the terminal contacting with a mating terminal of a mating connector is capable of shifting within a specific amount, and to an electrical connector assembled component that includes the electrical connector and a mating connector thereof.

A conventional electrical connector of this type has been disclosed in, for example, Patent reference. The conventional electrical connector includes male terminals made through punching a sheet metal in a sheet thickness direction. The male terminals have a shape of a transverse S-character, in which a U-shape section thereof is connected to an inverse U-shaped section thereof. The male terminals also include contact points to contact with mating terminals of the mating connector, and the contact points are formed at arm sections at a free arm side of the U-shaped sections.

Patent Reference: Japanese Utility Model Application Publication No. 04-051782

In the conventional electrical connector, the inverse U-shaped sections of the male terminals function as intermediate parts. Accordingly, the free end-side arm that forms the contact point can elastically displace in a direction to move towards or away from the inverse U-shaped section, i.e., in the width direction of the conventional electrical connector. As such, it is possible to secure contact pressure at the contact points, and to enable the elastic displacement also in the terminal arrangement direction (an arrangement pitch direction of the male terminals), that is the plate thickness direction of the male terminals. The terminal arrangement direction is a longitudinal direction of the conventional electrical connector, and usually a number of terminals are arranged in the terminal arrangement direction.

The conventional electrical connector is attached to a circuit board for use and often is fitted and connected to a mating connector mounted on another circuit board. In this case, all the terminals may not always contact and connect to mating terminals at normal positions due to manufacturing errors and mounting/attaching errors, and the terminals could be off from their normal positions. In this case, according to the conventional electrical connector disclosed in Patent Reference, described above, the male terminals can elastically displace not only in the width direction of the conventional electrical connector but also in the terminal arrangement direction. Therefore, it is possible to absorb any influence from the displacement by the elastic displacement in the plate thickness direction of the male terminals.

In addition, according to the conventional electrical connector disclosed in Patent Reference, it is also possible to absorb the displacement in the width direction of the conventional electrical connector perpendicular to the terminal arrangement direction through elastic displacement of the male terminals within the sheet surface thereof. Therefore, the positions of the contact points where the terminals contacts with the mating terminals of the mating connector can move in both the terminal arrangement direction and the width direction of the conventional electrical connector, forming a so-called "floating structure".

According to the conventional electrical connector disclosed in Patent Reference, however, there are mechanical and electrical issues due to generation of additional elastic displacement on the terminals so as to be capable of adding elastic displacement necessary for obtaining the contact pressure with the mating terminals and enabling the floating of the conventional electrical connector.

First, as the mechanical issues, in case of a connector in which a number of terminals are arranged, in order to enable the floating so as to absorb the displacement, if the terminals are elastically displaced, the counterforce by the elastic displacement tends to be strong since the total number of the terminals is large. Accordingly, it is difficult to obtain the floating to a sufficient extent in some cases. As a result, contact failure may occur at the terminals. Furthermore, it is not preferred in view of the strength that the terminals always generate a stress by the elastic displacement.

The electrical issues include deterioration of high-speed transmission characteristics. As described above, according to the conventional electrical connector disclosed in Patent reference, in order to enable the floating as well as the elastic displacement necessary for the contact pressure to the mating terminals, additional elastic displacement is generated on the terminals. In order to fully secure the elastic displacement, the inverse U-shaped sections, which are portions that can elastically displace, need to be long. As obvious from Patent reference, in the terminals of the conventional electrical connector, both arms of the inverse U-shaped sections have generally the same lengths as those of other portions, i.e., the U-shaped sections, so as to obtain displacement greater than the elastic displacement necessary for secure contact with the mating terminals. Accordingly, the signal transmission length tends to become long, which in turn may cause deterioration of the high-speed transmission characteristics.

In order to solve the problems of the conventional electrical connector described above, an object of the present invention is to provide an electrical connector and an electrical connector assembled component having the electrical connector and a mating connector thereof capable of solving the problems. In the present invention, it is possible to solve the mechanical and electrical issues of the conventional electrical connector described in Patent Reference without requiring additional elastic displacement for the floating, which is greater than the minimum elastic displacement necessary for the contact pressure to obtain upon contacting with the mating terminals of the mating connector.

Further objects and advantages of the present invention will be apparent from the following description of the present invention.

SUMMARY OF THE PRESENT INVENTION

According to a first aspect of the present invention, an electrical connector includes a plurality of terminals made of a sheet metal, and a housing that supports the terminals with terminal grooves thereof being arranged in a direction perpendicular to sheet surfaces of the terminals. The housing has a fitting section to fit to a mating connector so as to be pulled out therefrom. Contact sections of the terminals, which contact with mating terminals provided in the mating connectors, are provided to be capable of being movable.

According to the first aspect of the present invention, the housing includes at least an upper housing and a lower housing, which are movably joined to each other at least in the terminal arrangement direction at a splitting surface to split the housing with a surface perpendicular to the up-and-down direction. The upper housing and the lower housing have restricting sections that contact each other so as to limit the relative movement within a certain amount. Each of the terminals extends over the upper housing and the lower housing. Each of the terminals is held in the terminal groove, which is formed by connecting an upper groove formed in the upper housing and a lower groove formed in the lower housing to each other. A groove width of the upper groove is formed to be narrower at the lower end side, so as to form a restricting position for restricting the position of a contact section of the terminal in a direction perpendicular to the plate surface of the terminal. In addition, the upper groove and the lower groove are formed to have a groove width greater than the narrow groove width in an area other than the restricting position.

According to the first aspect of the present invention, in the electrical connector having the above-described configuration, the upper housing and the lower housing are movable at least in the terminal arrangement direction within the certain amounts. Further, the terminals are held in the terminal grooves of the upper housing and the lower housing only at the upper end sides and the lower end sides. Movements of the terminals are not restricted at the portions with the wide groove width, other than portions with the narrow groove width, where movements are restricted in the up-and-down direction. Therefore, even when the upper end side and the lower end side of each terminal moves in a terminal arrangement direction due to displacement of the upper and the lower housings in the terminal arrangement direction so as to be in a floating state, any portion thereof other than the one causes contact pressure by contacting with a mating terminal does not elastically deform due to the floating, and simply tilt. As a result, elastic displacement of the terminals for the floating is not necessary.

According to a second aspect of the present invention, the upper housing has a fitting section on an upper surface side thereof and the lower housing has a fitting section on a lower surface side thereof. Accordingly, the mating connector and the other mating connector can fit to the upper housing and the lower housing at corresponding fitting sections, respectively. Accordingly, it is possible to connect one of the two different mating connectors from above and the other from under. Therefore, it is possible to use the electrical connector as so-called an intermediate connector.

According to a third aspect of the present invention, it is preferred that a plurality of the terminals is composed of signal terminals and grounding terminals. Each grounding terminal has a shaft-like sliding contact section, which extends in a width direction of the housing, at a position of the splitting surface of the housing in the up-and-down direction. A plurality of the terminals is held at fixed positions in the terminal arrangement direction respectively by the upper housing and the lower housing, and the sliding contact sections of the grounding terminals are supported from above and under by the upper grounding connection member and the lower grounding connection member so as to be capable of making sliding contacts.

According to the third aspect of the present invention, when the upper housing that holds the upper grounding connection member and the lower housing that holds the lower grounding connection member move relative to each other in the terminal arrangement direction, the upper grounding connection member and the lower grounding connection member can move relative to the sliding contact sections, while the upper grounding connection member and the lower grounding connection member contact with the sliding contact sections of the grounding terminals.

According to the third aspect of the present invention, the terminals at suitable positions in the terminal arrangement direction are the grounding terminals. Further, the upper grounding connection member and the lower grounding member, which extend in the terminal arrangement direction, are provided so as to be capable of tightly holding from above and from under and of sliding to contact with the shaft-like sliding contact sections of the grounding terminals. When viewed from the up-and-down direction, the grounding terminals and the upper and lower grounding connection members form lattice-like shielding structure. Accordingly, it is possible to allow relative movements of the upper and the lower housings in the terminal arrangement direction and to enable the floating of the grounding terminals in the terminal arrangement direction without elastic deformation in the direction.

According to a fourth aspect of the present invention, the upper grounding connection member and the lower grounding connection member preferably include sections to be held. Further, the sections are respectively held by the upper housing and the lower housing. Further, the upper grounding connection member and the lower grounding connection member preferably include elastic sections to generate an energizing force to the sliding contact sections.

According to a fourth aspect of the present invention, with the configuration described above, the upper and the lower grounding connection members can contact with the grounding terminals at the sliding contact sections of the grounding terminals under elastic pressure, which can securely maintain the contact.

According to a fifth aspect of the present invention, the upper grounding connection member and the lower grounding connection member can be configured so as to have respective sections to be held and elastic sections positioned on a surface including the terminal arrangement direction and the up-and-down direction. In addition, the elastic sections can be configured to be positioned on a side close to the sliding contact sections of the grounding terminals relative to the sections to be held in the up-and-down direction or on the opposite side, which is a side close to a housing wall surface.

According to a sixth aspect of the present invention, it is possible to assemble an electrical connector assembled component from the above-described electrical connector and the mating connectors. The electrical connector assembled component includes the electrical connector of the present invention and the mating connectors to fit and connect to the electrical connector. The electrical connector includes a pivot protrusion, whereby at least one of an upper surface of the upper housing and a lower surface of the lower housing contacts with corresponding bottom wall surface of the housing of the mating connector, at a center in the connector's width direction. In addition, there is formed a gap between the electrical connector and the side wall surfaces of the mating connectors in the width direction, so that the electrical connector can rotate around the axis extending in the terminal arrangement direction and tilt having the pivot protrusion as a fulcrum. According to the electrical connector assembled component, the electrical connector can tilt around the pivot protrusion relative to the mating connectors.

As described above, according to the present invention, the upper end sides and the lower end sides of the terminals are accommodated in the terminal grooves of the upper housing and the lower housing, which are split into an upper piece and a lower piece, as the supporting positions. Further, the upper and the lower housings support the terminals in the terminal arrangement direction in the terminal grooves having the narrow groove width, and the terminal grooves have the wider width in areas other than the supporting positions on the upper end side and the lower end side. Therefore, even when the upper and the lower housings move relative to each other in the terminal arrangement direction, the terminals only tilt, and the elastic displacement is not generated for the relative movement. Accordingly, the terminals can have short arms, which can generate the minimum elastic displacement necessary for the arms to secure the contact pressure, thereby obtaining mechanical and electrical benefits.

BRIEF DESCRIPTION OF THE DRAWINGS

FIGS. 4(A) and 4(B) are perspective views showing the terminals of the electrical connector according to the first embodiment of the present invention, wherein FIG. 4(A) is a perspective view showing signal terminals and FIG. 4(B) is a perspective view showing grounding terminals;

FIG. 5(B) is a sectional view taken at a position of the grounding terminal;

FIGS. 7(A) and 7(B) are perspective views showing grounding terminal connect members and the terminals of the electrical connector according to the first embodiment of the present invention, wherein FIG. 7(A) is a perspective view showing grounding connection members and FIG. 7(B) is a perspective view showing signal terminals and the grounding terminal;

FIGS. 8(A) and 8(B) are sectional views showing the electrical connector taken at a surface provided in a space between a side wall and a center protruding wall of the housing in the connector width direction and extending in the up-and-down direction and the longitudinal direction according to the first embodiment of the present invention, wherein FIG. 8(A) is a sectional view showing the electrical connector in which the upper and lower housings are at normal positions, and FIG. 8(B) is a sectional view showing the electrical connector in which the upper and the lower housings are displaced relative to each other in the longitudinal direction;

FIGS. 9(A) and 9(B) are sectional views showing an electrical connector assembled component after assembling taken at a surface that is perpendicular to the longitudinal direction and along the connector width direction so as to include the grounding terminal according to the first embodiment of the present invention, wherein FIG. 9(A) is a sectional view showing the connector assembled component in which the mating connectors are at normal positions, and FIG. 9(B) is a sectional view showing the electrical connector assembled component in which the mating connectors are displaced relative to each other in the connector width direction;

FIGS. 10(A) and 10(B) are perspective views showing grounding connection members of an electrical connector according to a second embodiment of the present invention, wherein FIG. 10(A) is a perspective view showing upper and lower grounding connection members of the electrical connector, and FIG. 10(B) is a perspective view showing the lower grounding connection member with one grounding terminal so as to show a physical relation with the grounding terminal;

DETAILED DESCRIPTION OF THE PREFERRED EMBODIMENTS

Hereunder, embodiments of the present invention will be described with reference to the accompanying drawings.

First Embodiment

Figure 1:
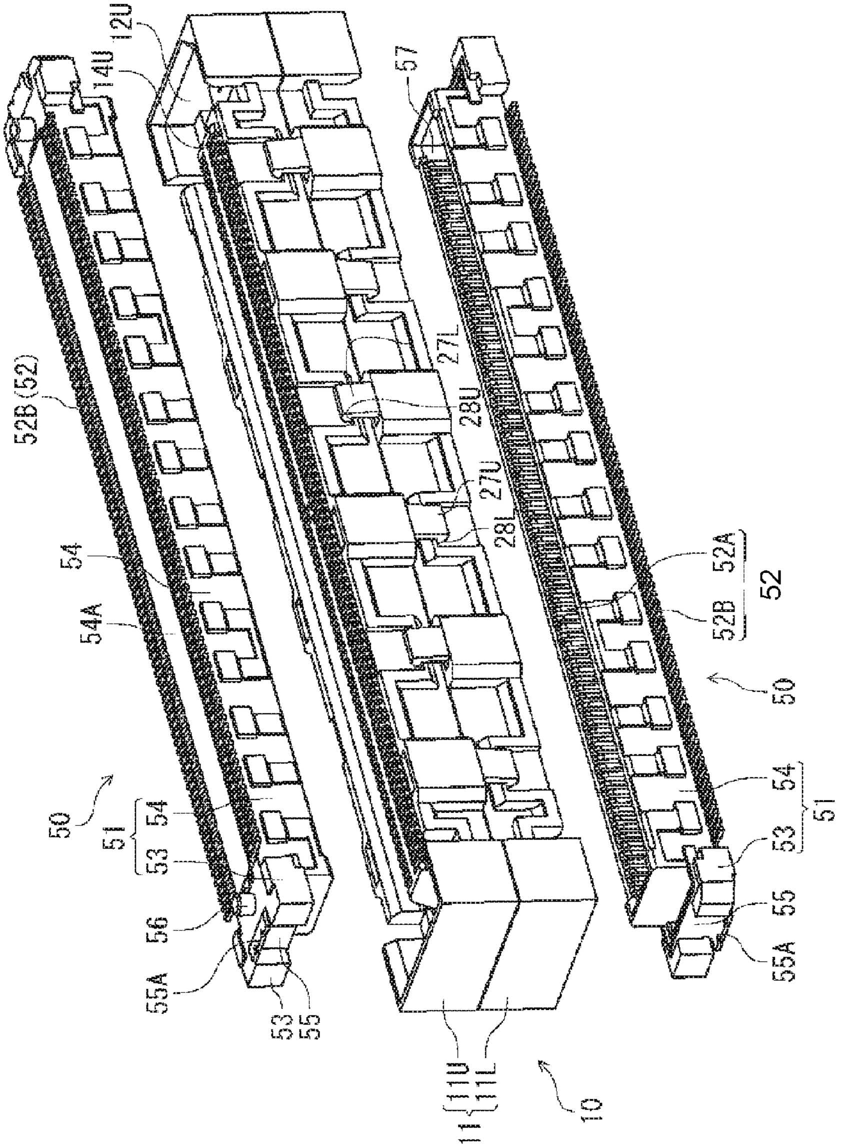
FIG. 1 is a perspective view showing an electrical connector, which can be used as an intermediate connector that composes an electrical connector assembled component, and two mating connectors thereof in state where the mating connectors are about to be fitted to the electrical connector, according to a first embodiment of the present invention.

A first embodiment of the present invention will be explained. FIG. 1 is a perspective view showing outer appearance of the electrical connector assembled component formed of an electrical connector of the present invention and two mating connectors, right before assembling.

In the electrical connector assembled component of FIG. 1, two mating connectors 50 having the same configuration are disposed above and below an electrical connector 10 of this embodiment before fitting those mating connectors 50 to the electrical connector 10 for assembling, in which one of the mating connectors 50 is flipped upside down relative to the other. Then, the mating connectors 50 are fitted to the electrical connector 10 from thereabove and from thereunder for the assembling.

In the embodiment, as shown in FIG. 1, the mating connectors 50 have a same configuration and are to be fitted to the connector 10 while the mating connectors 50 are respectively mounted on circuit boards (not illustrated) and one of the mating connectors 50 is flipped upside down relative to the other so as to fit the mating connectors 50 to the connector 10. Therefore, since the two mating connectors having the same configuration, to understand the bottom-side configuration of the mating connectors 50 for mounting on a circuit board, we can see the view of the upper mating connector 50 disposed above the connector 10 in FIG. 1, whereas we can see the view of the lower mating connector 50 disposed under the electrical connector 10 to understand the fitting-side configuration of the mating connectors 50. For this reason, the mating connectors will be described with reference to both connectors 50 disposed above and under the electrical connector 10 in FIG. 1. Each mating connector 50 has a housing 51 having an outer shape of a generally rectangular parallelepiped that is long in one direction. The housing 51 holds a plurality of terminals 52, having a longitudinal direction of the housing 51 as an arrangement direction. In addition, the housing 51 also holds securing metal fittings 55 at both ends in the longitudinal direction of the housing 51.

As shown in FIG. 1, in the mating connector 50 provided under the connector 10, the housing 51 has attachment sections 53 formed at both ends in the longitudinal direction projecting from the bottom-side portion, and a fitting section 54 that has a cylindrical shape with a bottom wall 54A, extends between the attachment sections 53, and protrudes higher than the attachment sections 53. Each attachment section 53 holds an L-shaped metal fitting 55, a solder securing section 55A that is the bent part thereof is to be at the same level as a bottom surface of the attachment section 53. In addition, as shown in the mating connector 50 disposed above the electrical connector 10, from a bottom surface of each attachment section 53, there is provided a cylindrical pin-shaped positioning protrusion 56 that protrudes into a corresponding hole of a circuit board.

As shown in FIG. 1, in the mating connector 50 disposed under the electrical connector 10, the fitting section 54 has a receiving section 57 that is formed by a circumferential wall of the fitting section 54, which perpendicularly extend from the bottom wall 54A, to be a concave shape for receiving a corresponding section of the electrical connector 10. The receiving section 57 is opened towards the electrical connector 10. In the receiving section 57, on inner surfaces of side walls of the circumferential wall, which extends in the longitudinal direction, contact sections 52A of the terminals 52 are arranged in the longitudinal direction. Connecting sections 52B of the terminals 52 held in the housing 52 are bent to extend sideway from the bottom of the housing 51 to be the same level as the bottom surface, and are provided for connection to the circuit board by soldering.

Figure 2:
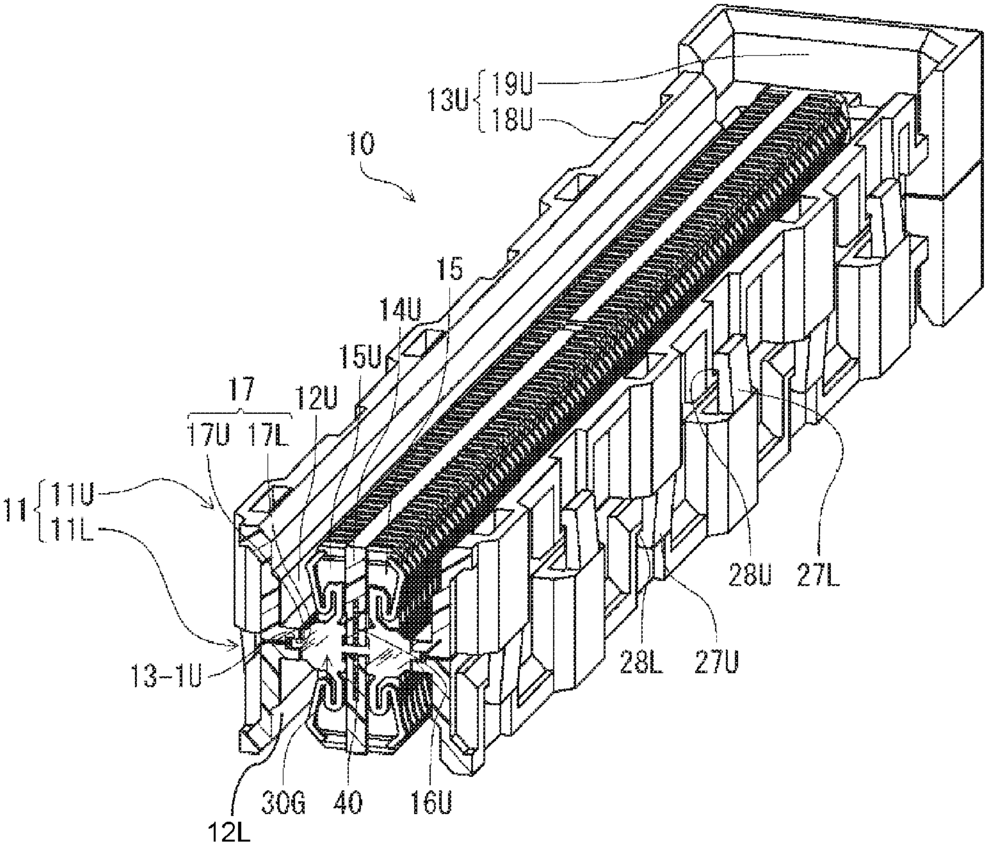
FIG. 2 is a sectional perspective view showing the electrical connector as the intermediate connector according to the first embodiment of the present invention.
Figure 3:
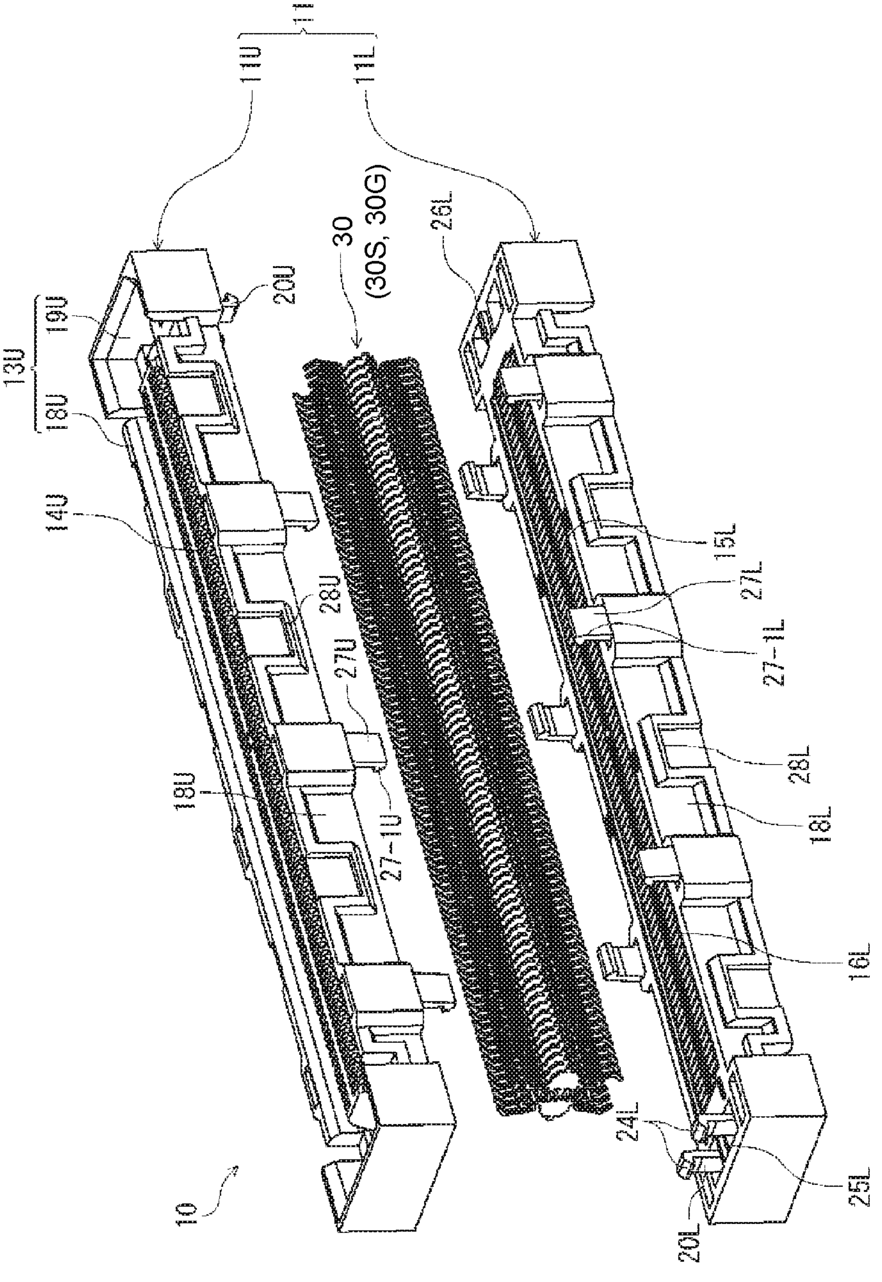
FIG. 3 is a perspective view showing the electrical connector as the intermediate connector, wherein an upper housing, terminals, and a lower housing thereof are separated from each other, according to the first embodiment of the present invention.

As shown in FIGS. 1-3, the electrical connector 10 for fitting the mating connectors 50 thereto from thereabove and thereunder includes the housing 11 composed of an upper housing 11U and a lower housing 11L, which are formed by splitting the housing 11 in the up-and-down direction having a surface perpendicular to the up-and-down direction as a splitting surface; terminals 30 held in the housing as shown in FIG. 2; and a grounding connection member 40.

Figure 6:
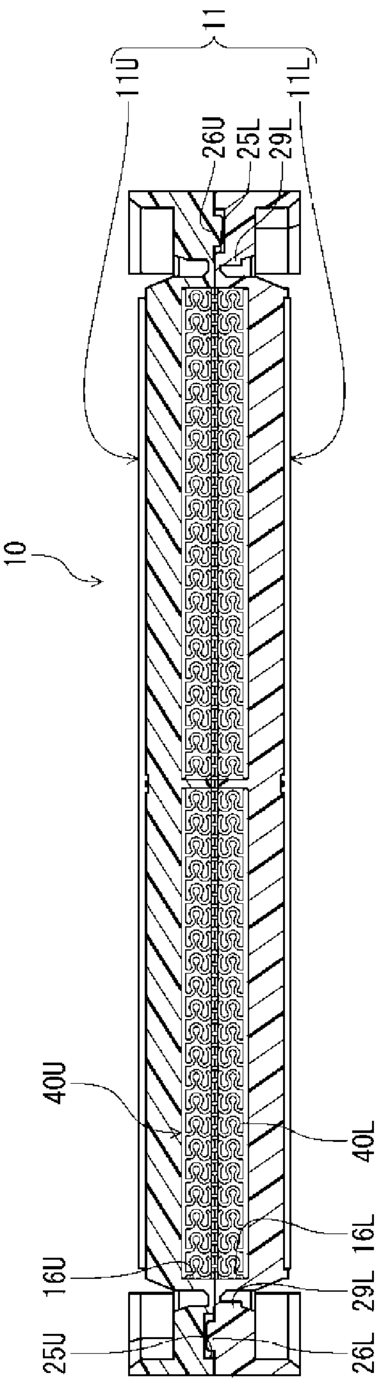
FIG. 6 is a sectional view showing the electrical connector taken at a surface extending in the longitudinal direction and an up-and-down direction at a center position in a width direction of the electrical connector according to the first embodiment of the present invention.

As shown in FIG. 4(B), which shows an example of different terminal arrangement, the terminals 30 are mix of signal terminals 30S and grounding terminals 30G arranged, or as shown in FIG. 4(A), only signal terminals 30S are arranged. As shown in FIGS. 2 and 6, each grounding connection member 40 is split in the up-and-down direction and includes an upper grounding connection member 40U and a lower grounding connection member 40L.

As shown in FIG. 4(A), the housings and other parts are used in pairs of members having the same shapes formed by splitting in the up-and-down direction, having one of them flip upside down relative to the other so as to face each other. In the description, the members are identified as members provided above or under by affixing “U” and “L” after the reference numerals of the sections. As for the signal terminals 30S and the grounding terminals 30G, which are very similar to each other, common sections are identified by affixing “S” and “G” to the same reference numerals, respectively. Therefore, it is possible to recognize whether a part/section is the same by the parts number and to recognize whether it belongs to an upper member or lower member by the alphabet affixed to the parts numbers.

The upper housing 11U and the lower housing 11L are formed to have the same configuration and shape, except that the lower housing 11L has a pivot protrusion, which will be described later, on a lower surface of a center protruding wall 14L and has a rib 29L, which will be described later. Flipping one of the upper housing 11U and the lower housing 11L relative to the other so as to have the receiving sections 57 face each other, and horizontally rotating them relative to each other for 180° around the center of an axis in the up-and-down direction, the upper housing 11U and the lower housing 11L are oriented as in FIG. 1. In the orientation, the upper housing 11U and the lower housing 11L are disposed symmetrically with respect to a point that is a center of imaginary line that connects center axis of the housings 11U and 11L in the up-and-down direction at a center in the longitudinal direction.

More specifically, when the housings 11U and 11L are disposed as in FIGS. 1-3, the both housings 11U and 11L are symmetrical with respect to a surface that extends at a center in the housing’s width direction along the up-and-down direction and the longitudinal direction, but not symmetrical with respect to a surface at a center in the longitudinal direction along the up-and-down direction and the width direction. In the longitudinal direction, one end of the upper housing 11U has the same configuration as the other end of the lower housing 11L, and the other end of the upper housing 11U has the same configuration as the one end of the lower housing 11L.

As shown in FIG. 6, the ribs 29L provided on the lower housing 11L are formed at a receiving section 12L, and when the lower mating connector 50 is fitted to the receiving section 12L, greater fitting force is generated than the one between the upper housing 11U and the upper mating connector 50. Therefore, even when the upper mating connector 50 is intentionally pulled from the upper housing 11U, it is possible to maintain the fitting state of the lower housing 11L to the lower mating connector 50.

The upper housing 11U and the lower housing 11L are assembled being positioned and oriented as described above, and have identical configuration except that the lower housing 11L has a pivot protrusion 14-1L. In the description below, explanation of the respective housings as a whole will be provided referring to a bottom surface-side portion of the upper housing 11U, which is exposed upward in FIGS. 1-3 and is a side to attach to a circuit board, and an upper portion of the lower housing 11L, which is a fitting side thereof.

As shown in FIG. 2 that also includes a sectional view, the upper housing 11U has a concave receiving section 12U on an upper side thereof as a fitting section for fitting to the mating connector 50. The receiving section 12U forms an annular shape between a circumferential wall 13U and an island-like center protruding wall 14U that extends upward from the bottom wall 13-1U along the longitudinal direction inside the circumferential wall 13U. Into receiving section 12U, the fitting section 54 of the mating connector 50 will be fitted.

In the embodiment, on wall surfaces of the center protruding wall 14U, there are arranged and held the terminals 30 (signal terminals 30S and grounding terminals 30G) in the longitudinal direction. On both wall surfaces of the center protruding wall 14U (wall surfaces that face the circumferential wall 13U), there are formed and arranged upper grooves 15U for accommodating a plurality of terminals 30 in the longitudinal direction. Each upper grove 15U extends towards the bottom wall 13-1U and through the bottom wall 13-1U and is opened downward. Corresponding sections of the terminals 30 enter from the bottom wall 13-1U to accommodate in the upper grooves 15U. The upper grooves 15U form terminal grooves 15 for holding terminals, being connected to the lower grooves 15L of the lower housing 11L similarly formed.

Figure 5:
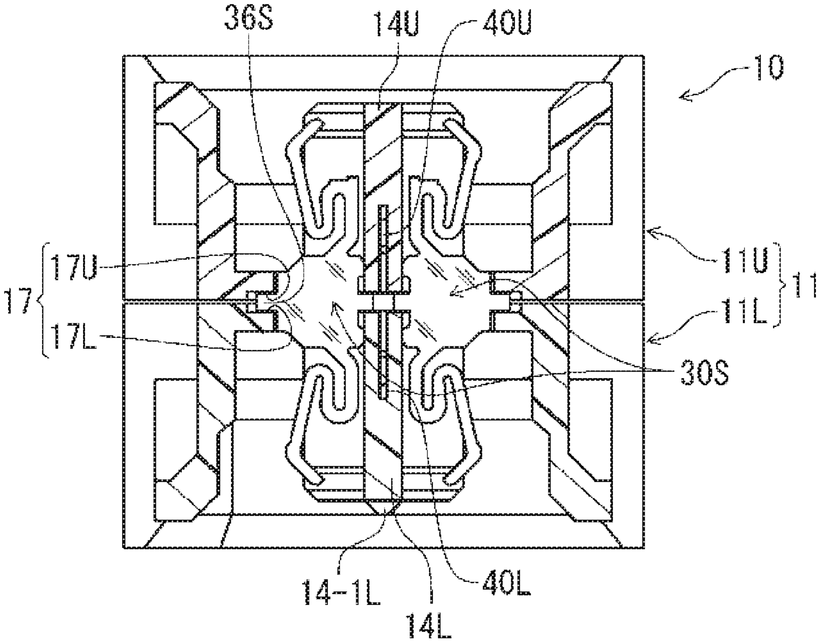
FIGS. 5(A) and 5(B) are sectional views showing the electrical connector taken at a surface perpendicular to a longitudinal direction of the electrical connector and parallel to terminal surfaces according to the first embodiment of the present invention, wherein FIG. 5 (A) is a sectional view taken at a position of the signal terminals
Figure 5:
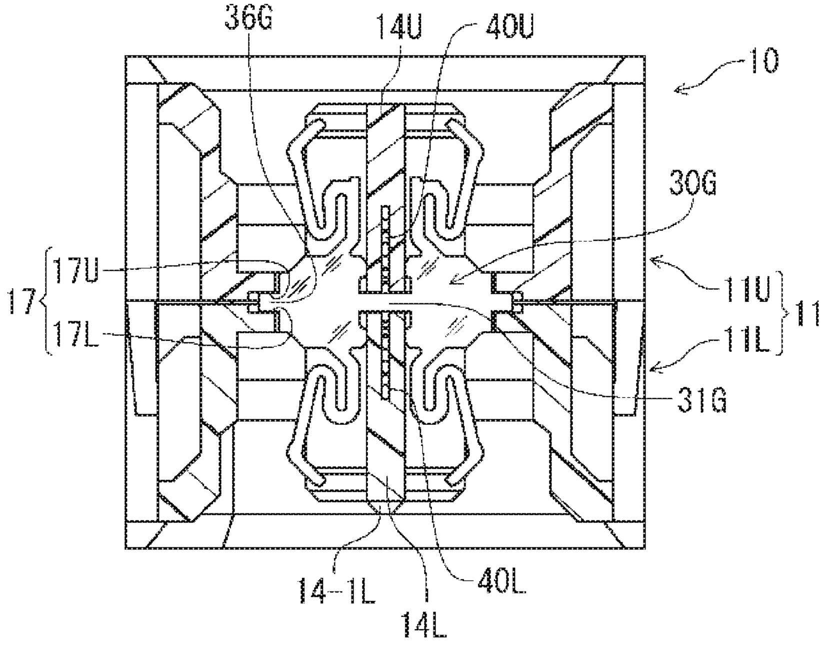

As shown in FIG. 2, on the center protruding wall 14U of the housing 11U, at a center in the width direction (i.e., a center in the wall thickness of the center protruding wall 14U), between bottoms of the upper grooves 15U of the both wall surfaces, slit-like holding groove 16U extends being opened downward. Into the holding groove 16U, the upper grounding connection member 40U is inserted from thereunder. In addition, on a lower surface of the bottom wall 13-1U, a step-like support section 17U extends in the longitudinal direction being adjacent to the lower end opening of the upper groove 15U, and connects the lower end openings of the upper groove 15U (See FIGS. 5 and 8).

The upper housing 11U has the circumferential wall 13U, which is formed by two side walls 18U extending in the longitudinal direction and two end walls 19U that joins the two side walls 18U at ends in the longitudinal direction. An upper part of each side wall 18U, i.e., opening-side portion of the receiving section 12U, has a smaller wall thickness than the lower part, and the distance between the side walls 18U is wide, so as to correspond to an outer dimension of the mating connector 50.

Figure 8:
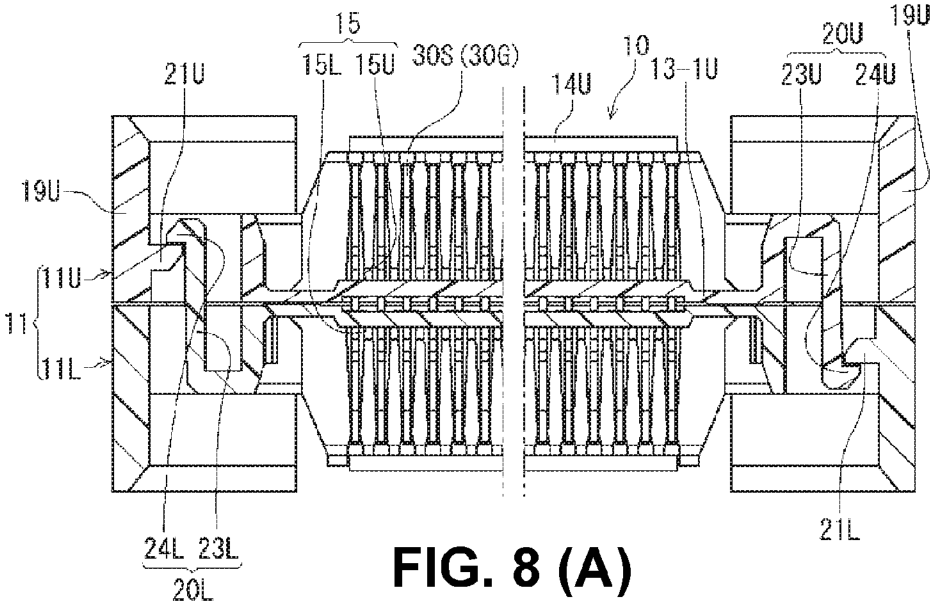
Figure 8:
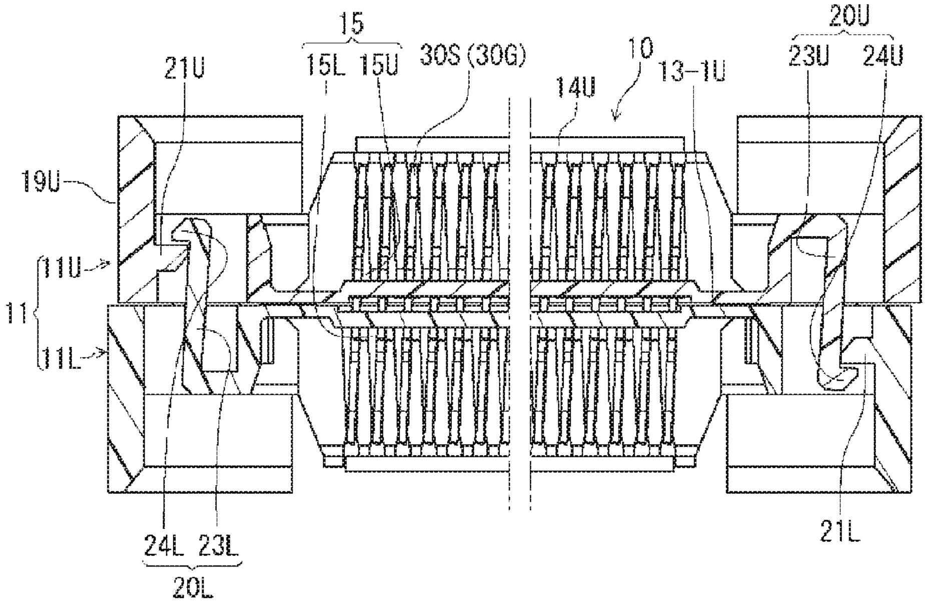

In the embodiment, at one end of the center protruding wall 14U in the longitudinal direction, as shown in FIGS. 3 and 8, at two positions facing across the center position in the housing width direction, a pair of locking legs 20U are provided towards the facing end walls 19U, and a pair of locking protrusions 21U are provided on an inner surfaces at the other end. On the lower housing 11L, there are provided a pair of locking protrusions 21L, which lock to the pair of locking legs 20U of the upper housing 11U in the up-and-down direction, and a pair of locking legs 20L, which lock with the pair of locking protrusions 21U of the upper housing 11U.

As shown in FIG. 8(A), each locking leg 20U includes a flexible leg section 23U, which extends from an end section of the center protruding wall in the longitudinal direction, extends upward from an end section of the bottom wall 13-1U, is then bent at an upper end of a vertical wall extending from an end of the bottom wall 13-1U, and then perpendicularly extends downward into the lower housing 11L; and a locking claw 24U, which extends from a lower end of the flexible leg section 23U and protrudes towards the locking protrusion 21L of the lower housing 11L.

In the embodiment, the locking legs 20U and 20L have elasticity at the flexible leg sections 23U and 23L, and can elastically deform in the housing's longitudinal direction. Upon fitting the upper housing 11U and the lower housing 11L to each other, the locking claws 24U and 24L of the locking legs 20U and 20L contact with corresponding locking protrusions 21L and 21U respectively, and by elastic deformation of the locking legs 20U and 20L, the locking claws 24U and 24L cross the locking protrusions 21L and 21U, and in a state of being recovered from the elastic deformation, the locking claws 24U and 24L lock to each other with the locking protrusions 21L and 21U in the up-and-down direction, and thereby it is possible to prevent the upper housing 11U from coming off from the lower housing 11L.

In the embodiment, the flexible leg sections 23U and 23L of the locking legs 20U and 20L have elasticity in the housing's longitudinal direction, which allows relative movements of the upper housing 11U and the lower housing 11L in the housing's longitudinal direction and also generate restoring force to the opposite direction during the movement.

As shown in FIG. 3, the upper housing 11U and the lower housing 11L have restricting holes 25U and 25L at center between the pair of locking legs 20U and the locking legs 20L in the housing's width direction on surfaces thereof that face each other, and restricting protrusions 26U and 26L between the pair of locking protrusions 21U and between the pair of locking protrusions 21L (See also FIG. 6). The restricting holes 25U and 25L are configured so as to movably insert the restricting protrusions 26L and 26U, respectively. The restricting protrusions 26U and 26L do not have movability in the housing's width direction and are restricted by the restricting holes 25U and 25L. In the housing's longitudinal direction, the restricting protrusions 26U and 26L have some movability, and the upper housing 11U and the lower housing 11L can move relative to each other for an amount of the movability of the restricting protrusions, while being guided by the restricting holes 25U and 25L.

In the embodiment, the upper housing 11U and the lower housing 11L are allowed to move relative to each other in the longitudinal direction for the amount of movability in the housing's longitudinal direction by the restricting holes 25U and 25L and the restricting protrusions 26U and 26L. Also in the relative movements, the upper housing 11U and the lower housing 11L do not separate from each other because of the locking legs 20U and 20L. In addition, the configuration also allows generation of restoring force, and as shown in FIGS. 1-3, the upper housing 11U and the lower housing 11L are inhibited from separation from each other while being allowed to move relative to each other, also by side locking legs 27U and 27L and locking step-like sections 28U and 28L, which are provided on outer surfaces of the side walls 18U and 18L.

As shown in FIGS. 1-3, the side locking legs 27U extend downward from a side wall 18U of the upper housing 11U, and the side locking legs 27L extend upward from a side wall 18L of the lower housing 11L. Those side locking legs 27U and 27L are provided so as to be alternately provided in the housing's longitudinal direction. On the other hand, at positions that correspond to the side locking legs 27U of the upper housing 11U in the housing's longitudinal direction, there are provided locking step-like sections 28L on the side wall of the lower housing 11L. At positions that correspond to the side locking legs 27L of the lower housing 11L, there are provided locking step-like sections 28U on the side wall 18U of the upper housing 11U. The widths of the locking step-like sections 28U and 28L (the lengths in the housing's longitudinal direction) are set greater than those of the locking claws 27-1L and 27-1U in the direction. The locking claws 27-1U and 27-1L are in state of being locked to the locking step-like sections 28L and 28U in the up-and-down direction, respectively, and the locking claws 27-1U and 27-1L slide in the housing's longitudinal direction on the locking step-like sections so as to be capable of moving relative to each other.

As shown in FIG. 8(A), the upper grooves 15U that form upper parts of the terminal grooves 15 formed on wall surfaces of the center protruding wall 14U of the upper housing 11U are recesses on the wall surfaces of the center protruding wall 14U and are formed in a plurality being arranged at intervals in the housing's longitudinal direction.

All the plurality of upper grooves 15U has an identical configuration. Each upper groove 15U has a narrowest width at a position on a side close to the upper surface of the upper housing 11U (i.e., the side away from the lower housing 11L), and restricts the terminal at the position. The groove width of each upper groove 15U formed larger as it goes downward from the restricting position, i.e., as it goes closer to the lower housing 11L. At the restricting position, the terminals 30 contact with the grooves with the narrowest groove width and are supported in a direction perpendicular to the sheet surfaces of the terminals 30, i.e., housing's longitudinal direction.

As described above, the upper housing 11U and the lower housing 11L have generally the same configuration, but the differences of the lower housing 11L from the upper housing 11U are that the lower housing 11L have column-like pivot protrusions 14-1L, each of which has a narrow tip, in a plurality positions in the housing's longitudinal direction on a lower surface of the center protruding wall 14L of the lower housing 11L, and the lower housing 11L has the ribs 29L on the receiving section 12L of the lower housing 11L in order to enhance fitting force of the lower housing 11L to the lower mating connector 50 than the fitting force of the upper housing 11U to the upper mating connector 50 (See FIG. 5(A)).

Figure 4:
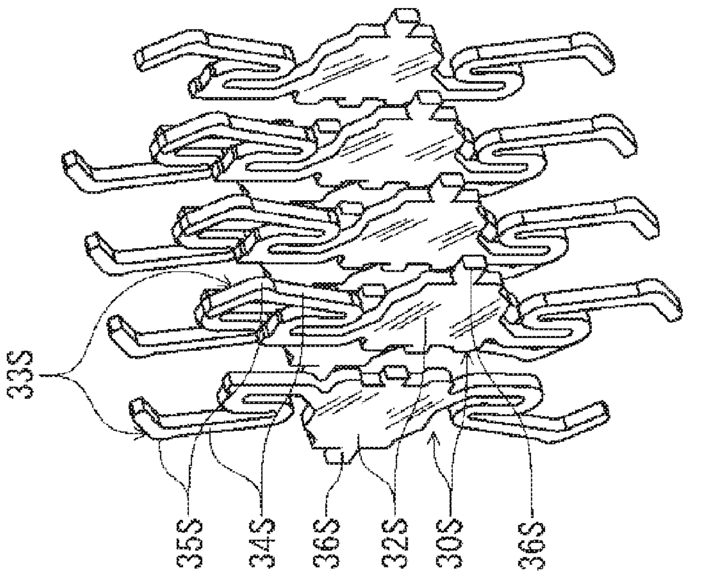
Figure 4:
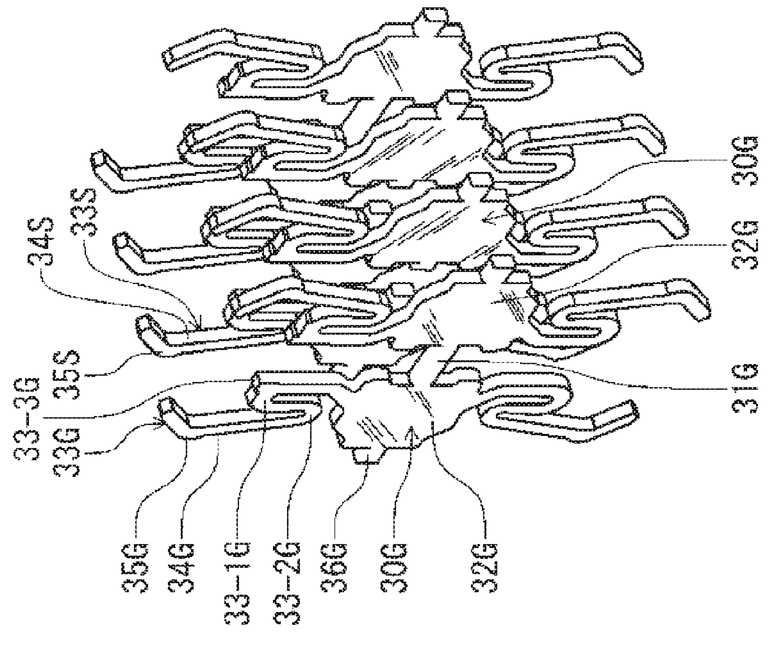

The terminals 30 are made keeping flat sheet surfaces of sheet metal. As shown in FIG. 4, the terminals 30 includes signal terminals 30S and the grounding terminals 30G that have very similar outer shapes to each other. As shown in FIG. 2, the signal terminals 30S and the grounding terminals 30G have their upper half parts accommodated in the upper grooves 15U of the upper housing 11U and have the lower half parts accommodated in the lower grooves 15L of the lower housing 11L, and have outer shapes so as to be capable of fitting in any of the plurality of upper grooves 15U (and the lower grooves 15L). The terminals 30 can be arranged in any manner, for example, it is possible to have all the terminals 30 as signals terminals 30S as shown in FIG. 4(A), which is an extracted view showing only four terminals, and it is also possible to dispose the grounding terminals 30G at both end positions as shown in FIG. 4(B).

Since it is easy to understand configuration of the signal terminals 30S in FIG. 4(A) and the grounding terminals 30G in FIG. 4(*b*), referring to those figures, both terminals 30S and 30G will be described. As understandable also from FIGS. 4(A) and 4(B), the signal terminals 30S and the grounding terminals 30G have very similar outer shapes, when a pair of left and right signal terminals 30S shown in FIG. 4(A) is joined, it is the same as the grounding terminal 30G. In other words, if the ground terminal 30G is separated at the shaft-like joining part at the center, the pieces are the same as a pair of left and right signal terminals. Therefore, explanation will be provided for the grounding terminals 30G except the joining section, and description of the same parts as those of the signal terminals 30S will be omitted affixing "S" after the corresponding reference numerals.

As described above, each grounding terminal 30G has a shaft-like joining section that laterally extends as a sliding contact section 31G for sliding contact with grounding contact members 40, which will be described later. Each grounding terminal 30G is formed to be generally symmetrical bilaterally and vertically. On the left and right sides of each sliding contact section 31G, there are provided basal sections 32G, which are formed as generally quadrilateral-shaped flat plates, and bent arms 33G extend upward and downward from each basal section 32G. In other words, one grounding terminal 30G includes two basal sections 32G and four contact arms 33G. Each basal section 32G has a section to be supported 36G on an outer edge thereof opposite the sliding contact section 31G, at a position laterally extended from the sliding contact section 31G. When the upper housing 11U and the lower housing 11L are fit to each other, sections to be supported 36G are held in support grooves 17 formed by step-like support sections 17U and support sections 17L, which extend in the housing's longitudinal direction, so that the sections to be supported 36G are supported in the up-and-down direction while having movability in the housing's longitudinal direction.

As described above, the four bent arms 33G are symmetrical bilaterally and vertically, so that direction of their extensions are different, but have the same configuration (there is a slight difference between the upper bent arms 33G and the lower bent arms 33G in the presence/absence of a protrusions formed from separation from carriers, and this difference will be described in later part of this specification). The bent arms 33G provided on the upper left in FIG. 4(B) will be described below.

Each bent arm 33G extends upward from an upper edge of the basal section 32G, then bent downward at an upper bent section 33-1G, and then bent upward at a lower bent section 33-2G so as to form a transverse S-shape, with a free end thereof extends upward greater than the upper bent section 33-1G. An elastic contact arm 34G is a section from the lower bent section 33-2G to the free end, and the elastic contact arm 34G extends sideway at a position close to the free end forms a contact section 35G, which is a point to contact with a mating terminal. On an upper edge of the upper bent section 33-1G, there is a protrusion 33-3G that is left as a part cut to separate from a carrier upon making the terminal 30G. Since the bent arm extending downward was not originally joined to a carrier, it does not have the protrusion 33-3G.

If the grounding terminal 30G is cut at the shaft-like sliding contact section 31G to separate the basal sections 32G with allowance that is enough for the left and right basal sections 32G do not contact with each other, the signal terminal 30S shown in FIG. 4(A) is obtained. In other words, as shown in FIG. 4(A), each of the pair of left and right signal terminals 30G extends from upper and lower sides of the basal section 32S, and has an elastic contact section arm 34S having a contact section 35S formed at on a side of a free end thereof.

As described above, it is possible to suitably dispose the grounding terminals 30G in the terminal grooves 15 provided in a plurality of positions in the terminal arrangement direction, which is the housing's longitudinal direction. According to this embodiment, there are provided the grounding connection members 40 for electrically connecting the plurality of grounding terminals 30G.

As shown in FIGS. 6 and 7(A), according to this embodiment, each grounding connection member 40 includes an upper connection member 40U held by the upper housing 11U, and a lower connection member 40 held by the lower housing 11L. Either of the upper and lower connection members 40U and 40L extends in a long range, which extends over the whole length of the housing 11 in the housing's longitudinal direction, so that each connection member 40U and 40L is cut at middle thereof to split into two parts. The upper grounding connection members 40U contact with the sliding contact sections 31G of the grounding terminals from thereabove, and the lower connection members 40L contact from thereunder, respectively.

In the embodiment, the upper grounding connection members 40U and the lower grounding connection members 40L are members having the same shape, and are simply disposed having two laterally disposed ones of them upside down, explanation will be provided only for the upper grounding connection members 40U. Explanation of the lower grounding connection member 40L will be omitted by indicating the same parts with the same reference numerals but affixed with "L" after the numbers.

Figure 7:
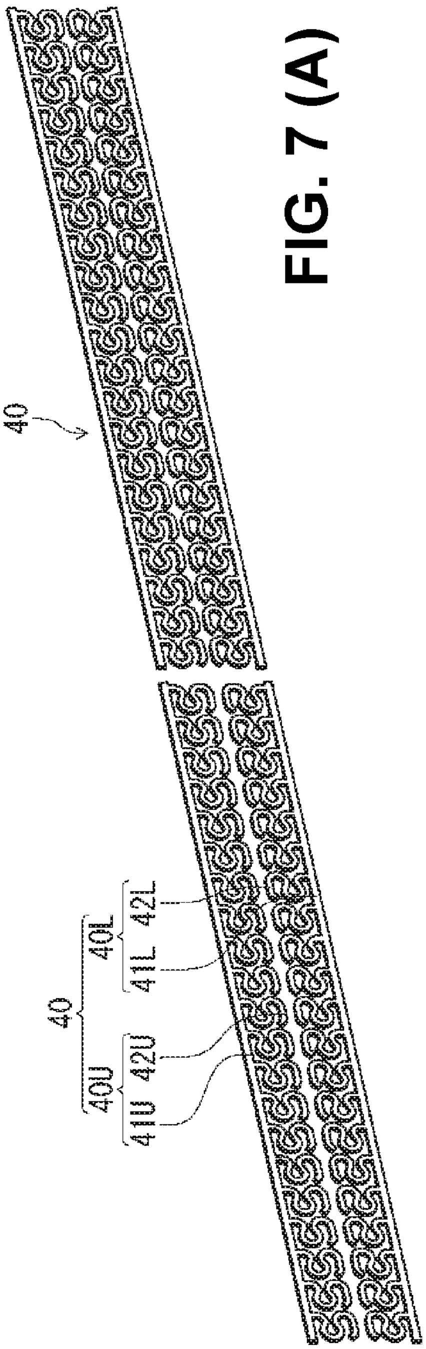
Figure 7:
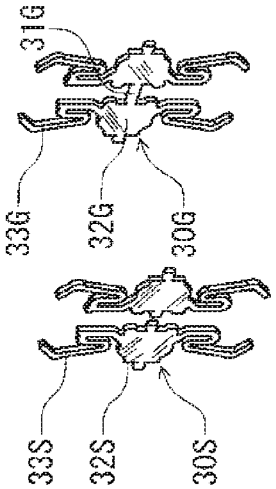

As shown in FIGS. 6 and 7, the upper grounding connection members 40U are made by punching a strip-like sheet metal, keeping their flat surfaces of the sheet metal. Each upper grounding connection member 40U includes a section to be held 41U formed as a thin strip section extending in the housing's longitudinal direction, and a plurality of elastic sections 42U that is joined to the section to be held 41U at the same pitch as that of the terminal arrangement and has generally S-shapes. The elastic sections 42U that are respectively bent to generally S-shapes can elastically displace in the up-and-down direction due to the shapes thereof. Such upper grounding connection members 40U are inserted from thereunder and held in the above-described slit-like holding groove 16U, which is provided under the center protruding wall 14U of the upper housing 11U and is opened downward.

Although the upper grounding connection members 40U are opened downward, as shown in FIG. 6, they have end surfaces in the housing's longitudinal direction, and restrict the both ends of the sections to be held 41U of the upper grounding members 40U between those end surfaces, and the upper grounding connection members 40U are held at the sections to be held 41U so as not to be able to move relative to the upper housing 11U in the housing's longitudinal direction. The upper grounding connection members 40U held in this way are positioned such that the lower ends of the elastic sections 42U protrude from the holding groove 16U. Accordingly, the elastic sections 42U elastically contact with the sliding contact sections 31G of the grounding terminals 30G, and the elastic sections 42L of the lower grounding connection members 40L that contact similarly, so that the sliding contact sections 31G are supported from thereabove and thereunder so as to be capable of making the sliding contacts.

As also shown in FIG. 7(B), the left and right signal terminals 30S described above referring to FIG. 4(A) are the ones formed by cutting each grounding terminal 30G to split into the two terminals 30S with allowance greater than the plate thickness of the grounding connection members 40U (the cutting is not simply cutting, but cutting so as to have greater dimension than the plate thickness), and the elastic sections 42U of the grounding connection members 40U are disposed within the allowance and do not contact with any of the left and right signal terminals 30S, even when they are at positions corresponding to the signal terminals 30 in the housing's longitudinal direction.

Therefore, the electrical connector 10 of the embodiment, in which respective members and parts are formed as described above, can be integrated, assembled, and used.

In order to obtain the electrical connector 10 that can be used as an intermediate connector, first prepare the lower housing 11L and then insert the grounding connection members 40L in the holding groove 16L of the lower housing 11L. The grounding connection members 40L are held in the holding groove 16L, while the tips of the elastic sections 42L protrude upward from the holding groove 16L.

Next, insert the signal terminals 30S and the grounding terminals 30G into the lower groove 15L, which forms a lower part of the terminal grooves 15 of the lower housing 11L, so as to form the terminal arrangement suitably set. The terminals 30 composed of signal terminals 30S and the grounding terminals 30G are consecutively inserted in the lower grooves while being cut to separate from carriers. Therefore, their upper parts above the center in the up-and-down direction protrude upward from the lower groove 15U in a state that the protrusions 33-3S and 33-3G are directed upward. In this state, the sections to be supported 36S and 36G of the signal terminals 30S and the grounding terminals 30G are supported at the step-like support sections 17L of the lower housing 11L. The contact sections 36S and the 36G of the signal terminals 30S and the grounding terminals 36G are located protruding towards the receiving section 12L of the lower grounding terminals 11L.

On the other hand, as for the upper housing 11U, in order to prepare for assembling to the lower housing 11L, similarly to the case of the lower housing 11L, insert the grounding connection members 40U in the holding groove 16U such that the grounding connection members 40U are held at the upper housing 11U.

Thereafter, direct the upper housing 11U towards the lower housing 11L as shown in FIG. 1, and attach it to the lower housing 11L bringing down as is. Upper parts of the terminals 30 protruding upward from the lower grooves of the lower housing 11L are accommodated in the corresponding upper grooves of the upper housing 11U.

Therefore, once the upper housing 11U is mounted onto the lower housing 11L, while being in state that a lower surface of the upper housing 11U and an upper surface of the lower housing 11L face and contact to each other, the locking claws 24U and 24L of the locking legs 20U and 20L respectively lock at the corresponding locking protrusions 21L and 21U, and the locking claws 27-1U and 27-1L of the side locking legs 27U and 27L lock at the corresponding locking step-like sections 28L and 28U. Therefore, it is possible to prevent coming off of the housings 11U and 11L from each other in the up-and-down direction. In this state, the restricting protrusions 26U and 26L of the upper and the lower housings 11U and 11L are held in the corresponding restricting holes 25L and 25U as shown in FIG. 6.

In addition, as shown in FIG. 6, the upper and the lower grounding connection members 40U and 40L elastically contact with the sliding contact sections 31G so as to tightly press the sliding contact sections of the grounding terminals 30G in the up-and-down direction at the elastic sections 42U and 42L. Here, as described above, the elastic sections 42U and 42L do not contact with the signal terminals 30S in this state. As such, it is possible to obtain the electrical connector 10 of the embodiment that can be used as an intermediate connector.

An operation of using the electrical connector 10 will be explained next. First, attach and connect two mating connectors 50 to circuit boards that respectively correspond thereto. The two mating connectors 50 are connected to the electrical connector 10 of the embodiment obtained as described above from thereabove and from thereunder, while being in state that the two mating connectors 50 are attached to the circuit boards.

More specifically, having the circuit board to which the lower mating connector 50 that is to be disposed under the electrical connector 10 as a lower side, dispose the lower mating connector 50 directing upward. Then, above the lower mating connector 50, position the electrical connector 10 having the lower housing 11L to be a lower side. Then, bring down the connector 10 towards the lower mating connector 50, and then fit and connect thereto. Fit the fitting sections 54 of the mating connector 50 in the receiving section 12L of the lower housing 11L.

In such state that the lower housing 11L is connected to the mating connector 50 disposed thereunder, the receiving section 12U of the upper housing 11U is opened upward. Then, fit and connect the fitting sections 54 of the mating connector 50 disposed, which is to be disposed thereabove and attached on the other circuit board, into the receiving section 12 of the upper housing 11U.

As such, the signal terminals 30S and the grounding terminals 30G of the electrical connector 10 are respectively connected to the corresponding signal terminals and grounding terminals of the two mating connectors 50, and the other circuit board is connected to the one circuit board via the mating connector 50 disposed above, the electrical connector 10 of the embodiment, and the mating connector 50 disposed thereunder. Since the lower housing 11L has the ribs 29L as described above, the lower mating connector 50 fits to the lower housing 11L with greater fitting force than that in the fitting of the upper mating connector 50 to the upper housing 11U.

However, since either the two mating connectors 50 are attached to the circuit boards, the relative positions of the both mating connectors 50 could be displaced from their normal positions.

First, as shown in FIG. 8(A), when the both mating connectors 50 are relatively displaced from their normal positions in the longitudinal direction, that is the terminal arrangement direction, while being in the state that the upper mating connector 50 fits to the upper housing 11U and the lower mating connector 50 fits to the lower housing 11L, the upper and the lower housings 11U and 11L can float in the same direction as shown in FIG. 8(B), and can absorb the displacement.

More specifically, in the upper and the lower housings 11U and 11L, the locking legs 20U and 20L have elasticity between the locking legs 20U and 20L and the locking protrusions 21L and 21U, and the side locking legs 27U and 27L and the locking step-like sections 28L and 28U are allowed to slide, and there is movability between the restricting protrusions 26U and 26L and the restricting holes 25L and 25U. Therefore, until the restricting protrusions 26U and 26L contact to be restricted from movement by the restricting holes 25L and 25U, they can move relatively in the longitudinal direction within the range of the movability.

At this time, as shown in FIG. 8(B), the terminals 30, i.e., the signal terminals 30S and the grounding terminals 30G, are only restricted from movement at the part having the narrowest width of the upper and the lower grooves 15U and 15L of the upper and the lower housings 11U and 11L that form the terminal grooves 15. Therefore, one terminal 30 is restricted and supported at two points or at a portion with wide groove width, and other part of the terminals 30 other than at the restricting position(s), can move without any restriction in the part of the terminal grooves 15 having wide groove width. Therefore, the terminals 30 only tilt in the grooves with the upper and the lower restricting points as fulcrum points, and the terminals 30 will not elastically displace in the longitudinal direction, i.e., the plate thickness direction of the terminals 30. Accordingly, the floating in the longitudinal direction occurs very freely without causing any stress on the terminals 30.

Figure 9:
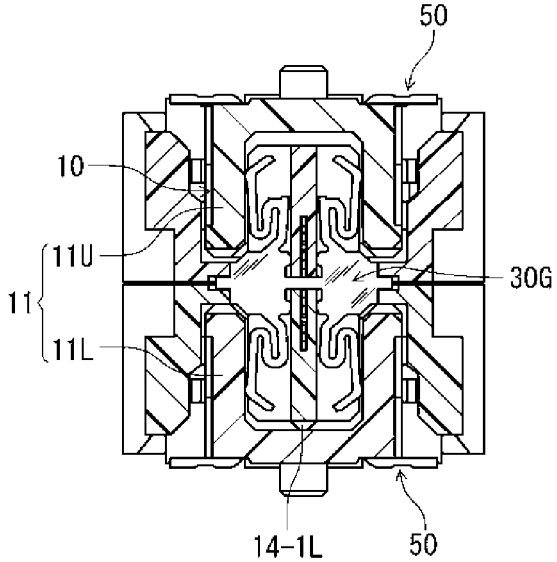
Figure 9:
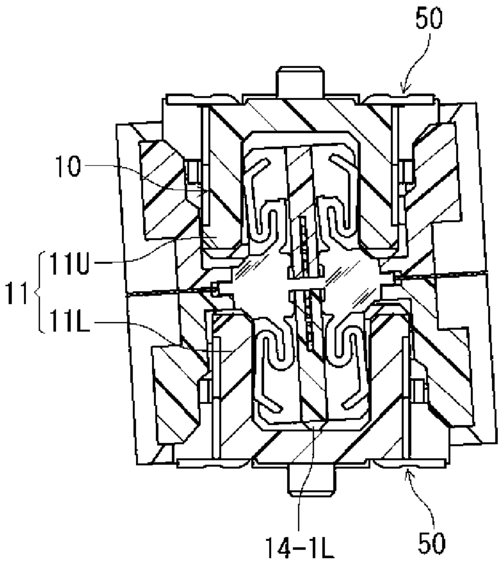

Next, a case will be described, in which the both connectors 50 displace from their normal positions in the connector's width direction that is a direction perpendicular to the longitudinal direction, the terminal arrangement direction, i.e. in a connector's lateral direction. For example, when the upper mating connector 50 is displaced leftward relative to the lower mating connector 50 as shown in FIG. 9(B) from the normal positions shown in FIG. 9(A), the electrical connector 10 can tilt relative to the mating connectors 50, having the pivot protrusion 14-1L, provided on a lower surface of the bottom wall of the lower housing 11L of the electrical connector 10, as a fulcrum.

In the embodiment, the upper and lower contact sections 35S and 35G of the signal terminals 30S and the grounding terminals 30G of the electrical connector 10 allow the tilting by their elastic displacement. Therefore, the electrical connector 10 only tilts relative to the mating connectors 50 while maintaining the normal contact state between the two mating connectors 50 and the terminals 30, and thereby the electrical connector 10 can be maintained as an electrical connector assembled component, being able to absorb by floating the displacement of the two mating connectors 50 in the lateral direction.

Second Embodiment

Figure 10:
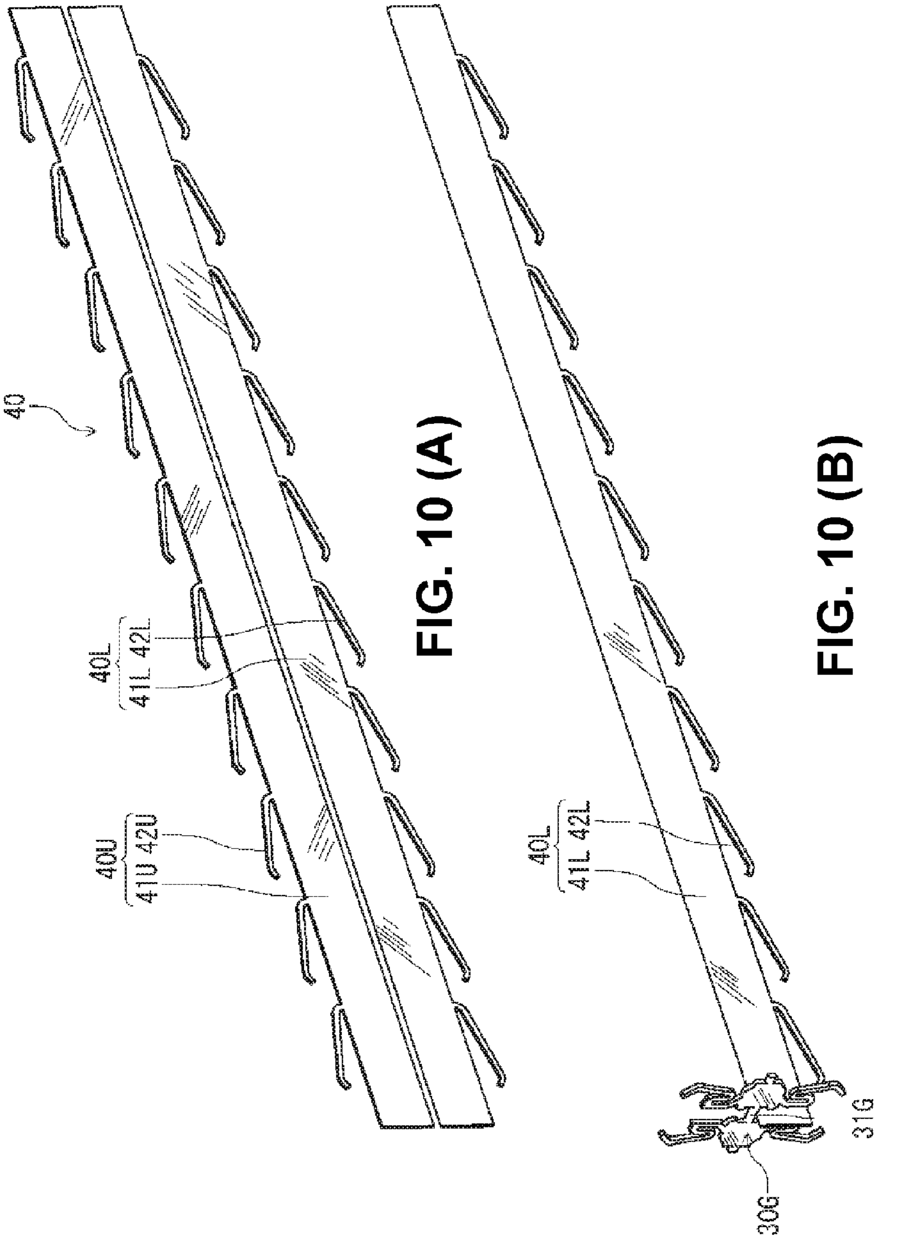

A second embodiment of the present invention will be explained next. The first embodiment shown in FIGS. 1-9 and described above can be altered, modified, and changed. For example, it is possible to form the grounding connection members 40 as generally plate-like members and function as grounding plates. The grounding connection members 40 shown in FIG. 10 include the upper and the lower grounding members 40U and 40L, but also in this case, the upper and the lower grounding connection members 40U and 40L have the same configuration and are disposed simply flipping one of them upside down relative to the other as shown in FIG. 10(A). Therefore, the embodiment will be described referring to the upper grounding connection member 40U.

An upper edge of the upper grounding connection member 40U includes a flat strip-like section to be held 41U that extends in the connector's longitudinal direction, and a thin elastic sections 42U that extend diagonally from an upper edge of the section to be held 41U and is bent towards the upper edge at the tips thereof. The elastic sections 42U are provided at a plurality of positions in the longitudinal direction.

The upper grounding connection member 40U is inserted and held in the holding groove 16U of the upper housing 11U, having the elastic sections 42U directed upward, and the lower grounding connection member 40L is inserted and held in the holding groove 16L of the lower housing 11L having the elastic sections 42L directed downward.

In the embodiment, the both ends of the flat strip-like sections to be held 41U and 41L in the longitudinal direction contact with the inside ends of the holding grooves in the longitudinal direction, and the upper and the lower grounding connection members 40U and 40L are held being restricted from movements in the longitudinal direction.

On the other hand, in the up-and-down direction, the elastic sections 42U and 42L can move in the holding grooves 16U and 16L, receiving counterforce from the groove bottoms of the holding grooves 16U and 16L. Therefore, in the upper and the lower grounding connection member 40U and 40L arranged as in FIG. 10(A), the lower edge of the section to be held 41U and the upper edge of the section to be held 41L contact and tightly hold the shaft-like sliding contact sections 31G of the grounding terminals 30G from thereabove and from thereunder with elastic force. FIG. 10(B) shows the lower grounding connection member 40L contacts with the sliding contact section 31G of the grounding terminal 30G from thereunder at the upper edge of the section to be held 41L (illustration of the upper connection member 40U is omitted in the figure). Using the grounding connection members 40U and 40L having the flat-strip-like sections to be held 41U and 41L, it is possible to obtain satisfactory shielding function between the signal terminals disposed bilaterally.

Third Embodiment

A third embodiment of the present invention will be explained next. Not only in an intermediate connector for connecting the upper and lower mating connector as shown in those figures, it is also possible to apply the present invention in other types of intermediate connectors, for example the one, in which the mating connectors are disposed being capable of inserting/removing in perpendicular direction.

Figure 11:
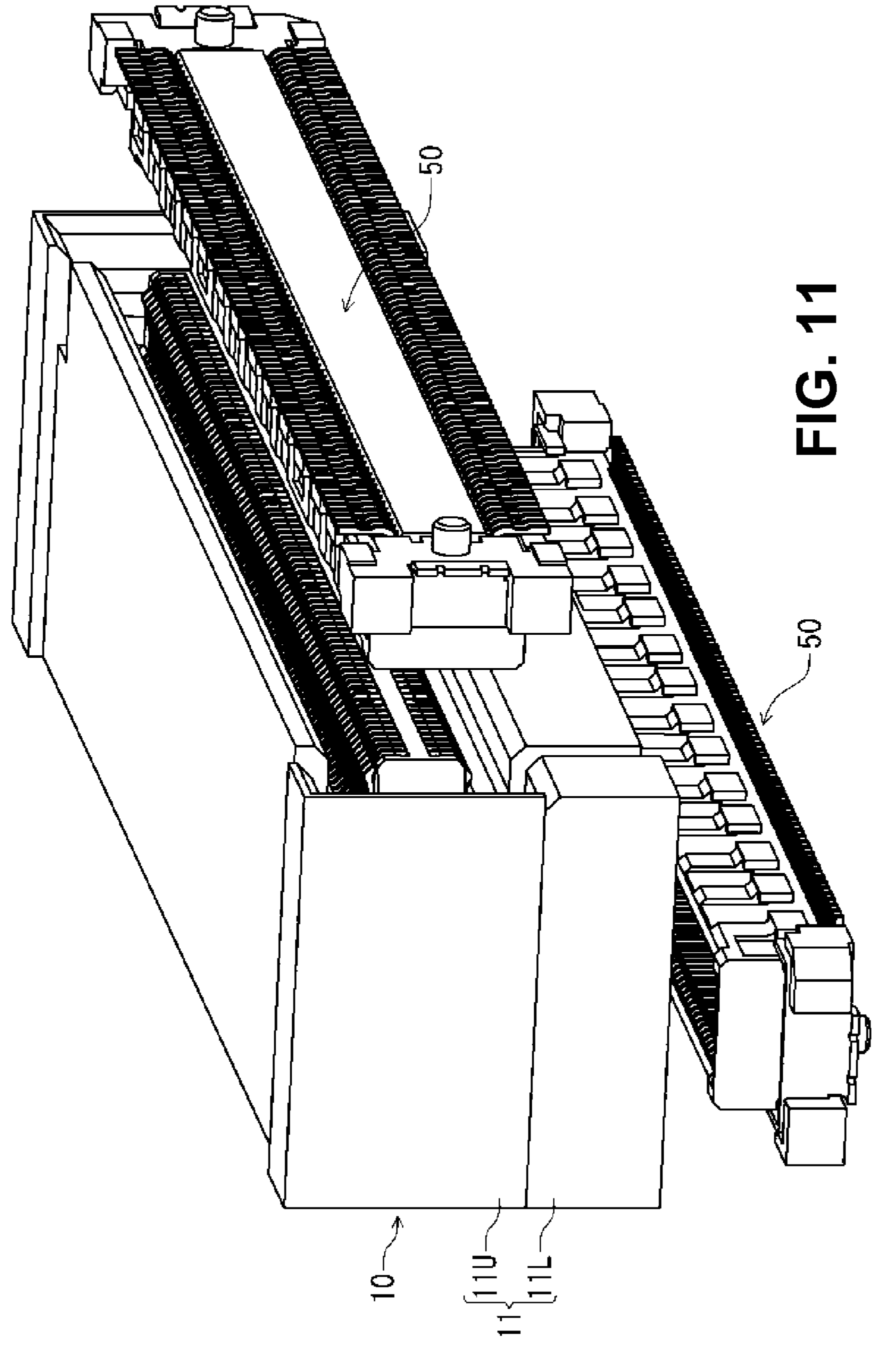
FIG. 11 is a perspective view showing an electrical connector assembled component before assembling according to a third embodiment.

For example, in FIG. 11, the connector 10 that functions as an intermediate connector includes the lower housing 11L to fit the lower mating connector 50 from thereunder, and the upper housing 11U for fitting the upper mating connector 50 in the lateral direction (from the right side in the figure). The upper housing 11U is joined to the lower housing 11L from thereabove. In other words, the splitting surface where the upper housing 11U and the lower housing 11L contact by surface is in a horizontal direction, and although the position of the splitting surface is the same as in FIG. 1, there are difference in the upper housing 11U has a concave receiving section for the mating connector 50, which is opened rightward, and the terminals 30 are bent to L-shapes.

Figure 12:
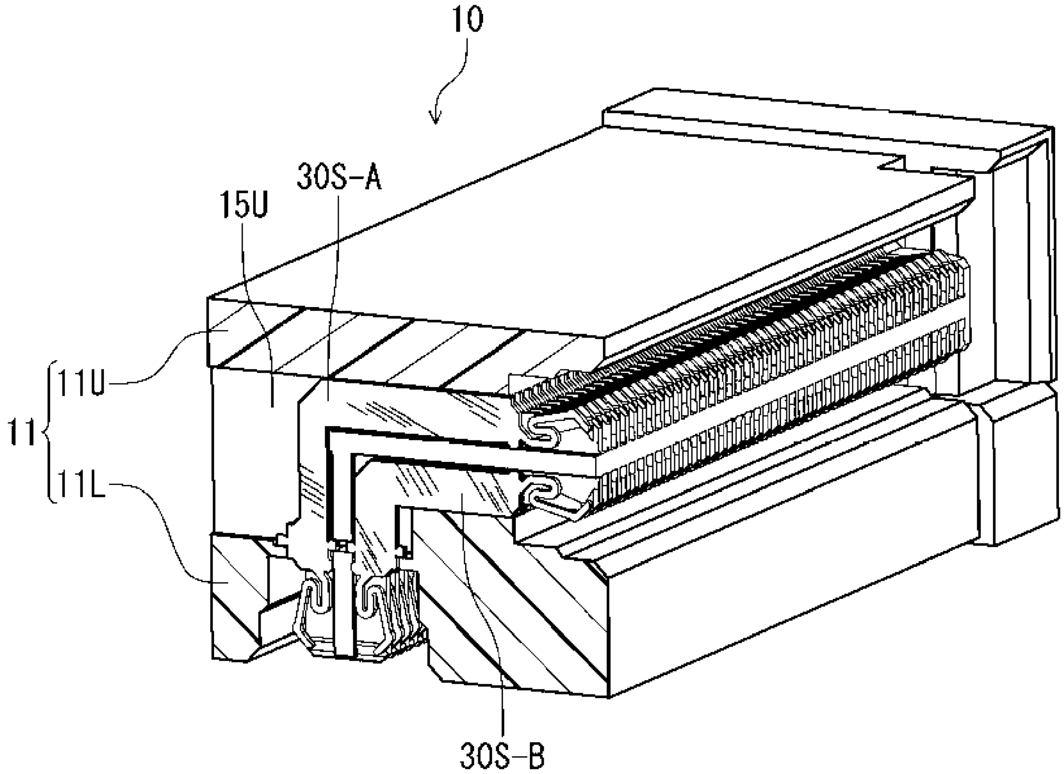
FIG. 12 is a sectional perspective view showing an intermediate connector of the electrical connector assembled component before according to the third embodiment.

As shown in FIG. 12, each signal terminal 30S (or similarly the grounding terminal 30G although it is not illustrated in the figure) of the connector 10 include the outer signal terminal 30S-A and the inner signal terminal 30S-B as a pair. Since a basal section 32S-A that forms a basal point for outward extending of the upper and the lower contact arms 33S-A are provided outside than the basal section 32S-B of the inner signal terminal, the outer signal terminal 30S-A that is bent to a L-shape (u-A" is affixed after reference numerals/codes for the same parts of the outer signal terminals as in FIG. 4 and "-B" is affixed for the inner signal terminals) is long.

According to the connector 10 shown in FIG. 12, first integrate the signal terminals 30S-A and 30S-B in the upper housing 11U, and then attach the lower housing 11L thereto. At this point, for attachment of the signal terminals 30S-A and 30S-B, the outer signal terminals 30S-A are first inserted in the upper groove 15U of the upper housing 11U from left side to the right side, and then the inner signal terminals 30S are inserted in the upper housing 11U from the opposite direction, i.e., from the right side to the left side.

According to the present invention, the terminals can be altered, modified, and changed. According to an example shown in the figure, any of the terminals 30 (signal terminals 30S and the grounding terminals 30G) is made keeping the flat plate surface of sheet metal as is, but it is also possible to bent a part of each terminal to a cranked step-like shape, in which the two plate surfaces are horizontal at both ends of the step-like section. In this case, when the step-like sections are small, it is possible to consider that the flat plate surface of sheet metal is substantially maintained.

The disclosure of Japanese Patent Applications No. 2013-112683, filed on May 29, 2013, is incorporated in the application by reference.

While the present invention has been explained with reference to the specific embodiments of the present invention, the explanation is illustrative and the present invention is limited only by the appended claims.

What is claimed is:

1. An electrical connector to be connected to a first mating connector and a second mating connector, comprising:

a plurality of terminals; and a housing for holing the terminals in a terminal arrangement direction, wherein said housing includes an upper housing and a lower housing attached to the upper housing, said upper housing includes a plurality of upper grooves for holding the terminals, each of the upper grooves has an upper narrow width portion having a width smaller than other part of the upper groove, said lower housing includes a plurality of lower grooves for holing the terminal, each of the lower grooves has a lower narrow width portion having a width smaller than other part of the lower groove, said upper housing includes an upper ground connecting member for holding one of the terminals, said lower housing includes a lower ground connecting member for holding the one of the terminals, said upper ground connecting member includes an upper held portion fixed to the upper housing and an upper elastic portion contacting with the one of the terminals, and said lower ground connecting member includes a lower held portion fixed to the lower housing and a lower elastic portion contacting with the one of the terminals.

2. The electrical connector according to claim 1, wherein said upper housing includes an upper fitting portion to be connected to the first mating connector, and said lower housing includes a lower fitting portion to be connected to the second mating connector.

3. The electrical connector according to claim 1, wherein said terminals include a signal terminal and a ground terminal.

4. The electrical connector according to claim 1, wherein said upper held portion and said upper elastic portion are situated on a same plane, and said lower held portion and said lower elastic portion are situated on a same plane.

5. The electrical connector according to claim 1, wherein said upper elastic portion and said lower elastic portion are situated closer to the one of the terminals relative to the upper held portion and the lower held portion.

6. An electrical connector assembled component, comprising the electrical connector according to claim 1;

the first mating connector; and the second mating connector, wherein at least one of said upper housing and said lower housing includes a pivot protrusion abutting against one of the first mating connector and the second mating connector to form a space in between.

* * * * *